(12) United States Patent
Narayanan et al.

(10) Patent No.: US 8,782,504 B2
(45) Date of Patent: Jul. 15, 2014

(54) TREND-ANALYSIS SCHEME FOR RELIABLY READING DATA VALUES FROM MEMORY

(75) Inventors: Santosh Narayanan, Bangalore (IN); Benzeer Bava Arackal Pazhayakath, Bangalore (IN); Vishal Deep Ajmera, Bangalore (IN); Sandesh Kadirudyavara Ven Gowda, Bangalore (IN)

(73) Assignee: LSI Corporation, San Jose, CA (US)

( * ) Notice: Subject to any disclaimer, the term of this patent is extended or adjusted under 35 U.S.C. 154(b) by 164 days.

(21) Appl. No.: 13/444,186

(22) Filed: Apr. 11, 2012

(65) Prior Publication Data

US 2013/0275843 A1    Oct. 17, 2013

(51) Int. Cl.
| G06F 11/10 | (2006.01) |
| H03M 13/00 | (2006.01) |
| G06F 11/00 | (2006.01) |
| G08C 25/00 | (2006.01) |
| H04L 1/00 | (2006.01) |

(52) U.S. Cl.
USPC .......................................... 714/807; 714/799

(58) Field of Classification Search
CPC ......... G06F 11/07; G06F 11/10; G06F 11/00; G06F 11/0703; G06F 11/0727; G06F 11/0751; G06F 17/30; G06F 3/00; G06F 7/24; H04L 29/08549; H04L 12/2419; G11B 20/00; G11B 20/10527; G11B 20/1204; G11B 2007/007; G11B 33/106; H04I 47/34
See application file for complete search history.

(56) References Cited

U.S. PATENT DOCUMENTS

| 4,071,701 | A | * | 1/1978 | Leijonhufvud et al. ...... 370/379 |
| 4,493,047 | A | | 1/1985 | Werst |
| 4,608,690 | A | * | 8/1986 | Judge ............................. 714/719 |
| 4,748,404 | A | | 5/1988 | Heinze et al. |
| 5,194,996 | A | * | 3/1993 | Shores ............................ 360/48 |
| 6,751,757 | B2 | * | 6/2004 | Biskup et al. .................. 714/54 |
| 7,047,270 | B2 | | 5/2006 | Agarwala et al. |
| 7,366,961 | B1 | * | 4/2008 | Kovacevic et al. ............ 714/701 |
| 7,509,656 | B2 | | 3/2009 | Bian et al. |
| 7,562,140 | B2 | | 7/2009 | Clemm et al. |
| 7,610,544 | B2 | * | 10/2009 | Guo ............................. 714/776 |
| 7,925,687 | B2 | | 4/2011 | Agarwala et al. |
| 7,986,994 | B2 | | 7/2011 | Stadler et al. |
| 8,120,965 | B2 | * | 2/2012 | Yang ........................ 365/185.21 |
| 8,453,032 | B2 | * | 5/2013 | Ross ............................. 714/758 |
| 8,578,223 | B2 | * | 11/2013 | Radulescu et al. ............ 714/718 |
| 2002/0007428 | A1 | * | 1/2002 | Chilton ........................... 710/52 |
| 2003/0149786 | A1 | | 8/2003 | Duffy et al. |
| 2011/0022886 | A1 | * | 1/2011 | Yang ................................ 714/5 |
| 2011/0231582 | A1 | | 9/2011 | Uysal et al. |
| 2011/0235634 | A1 | * | 9/2011 | Fukuda et al. ................ 370/389 |

* cited by examiner

*Primary Examiner* — Guerrier Merant
(74) *Attorney, Agent, or Firm* — Mendelsohn, Drucker & Dunleavy, P.C.; Kevin M. Drucker; Steve Mendelsohn

(57) ABSTRACT

In one embodiment, a scheme for reliably reading data values, such as rapidly-changing counter values, from a memory location. Instead of performing a single read operation, a set of N consecutive read operations is performed to obtain a set of N samples. Since, for counter values and the like, the frequency of occurrence of out-of-sequence values is relatively low, it is expected that a majority of the N samples will be in sequence. Of these N samples, the largest subset of monotonically-increasing values is selected. The median value of this subset of monotonically non-decreasing values is returned as a reliable result of the read operation.

34 Claims, 4 Drawing Sheets

TREND-ANALYSIS SCHEME FOR RELIABLY READING DATA VALUES FROM MEMORY

BACKGROUND OF THE INVENTION

1. Field of the Invention

The present invention relates, generally, to the reading of stored values from a memory location, and more particularly but not exclusively, to the identification of erroneous values returned during such reads.

2. Description of the Related Art

This section introduces aspects that may help facilitate a better understanding of the invention. Accordingly, the statements of this section are to be read in this light and are not to be understood as admissions about what is prior art or what is not prior art.

Various applications involve the use of memory locations that contain continuously-changing values. For example, in networking systems such as routers, switches, gateways, and mobile backhaul systems, packet counters and byte counters are implemented at various stages of packet processing, based on various fields in the packets being processed. Network-protocol stack implementations employ packet-level and byte-level counters at various levels of granularity. The usefulness and criticality of such counters are of paramount importance, because such counters are linked to standard, management information base (MIB)-level counters, which are used by service providers, e.g., for billing, accounting, and monitoring purposes.

Often, in network processor-based implementations, counters are implemented with a fixed resolution (in terms of the number of bits used to represent a counter) and are often read periodically to account for rollovers. Such counters are implemented in the data plane, i.e., the processing units where packet-forwarding and/or packet-switching decisions are made in real time. The control plane, i.e., the configuration unit, periodically reads these counter values from data-plane memory and interprets those values.

In hardware-based implementations, such as programmable network processors, such counters are typically maintained in memory elements by the data plane and are periodically read by the control plane for interpretation. A common problem that occurs during this process is the manifestation of spurious read errors. Such errors can lead to inaccurate statistics, from which recovery can be difficult or impossible.

For example, if the control plane reads a spurious value from the data plane for a counter, this can often result in an irrecoverable error. Such an error can have a disastrous impact on network billing and other processes that rely on the counters and packet statistics.

More specifically, such packet and/or byte counters may be maintained, e.g., in an statistics engine memory space or in a traffic-manager (TM) and/or traffic-shaper (TS) parameter memory space.

ASI memory can be used to maintain packet statistics during an initial packet-classification stage, prior to being handled by a traffic-manager engine. Since the traffic manager can drop packets based on traffic-management algorithms, ASI counters might not be sufficiently accurate for statistics regarding transmitted packets.

TM/TS-parameter memory has a fixed number of bytes used for maintaining packets and/or bytes transmitted from a particular queue of an interface. TM/TS counters, for each of the queues of the interface, are periodically read by the control-plane software, which estimates the number of packets and/or the number of bytes transmitted over the interface.

Periodic reading of the TM/TS-parameter memory by the control plane is performed to estimate counter rollovers. The control plane detects a counter rollover by comparing the current read value with the previous value. If the current value is smaller than the previous value, then a rollover is detected, and a control-plane version of the counter (e.g., an MIB counter) is incremented appropriately.

Transient TM/TS-parameter memory-read errors can cause the periodic return of spurious values for certain counters. In turn, these spurious read values cause incorrect counter increments in the control-plane version of the counters.

Even more serious is the case when the spurious value is such that it causes the control-plane logic to detect a false counter rollover. False counter-rollover detection occurs when the read value in one instance is a spurious value that is smaller than the previously-read value. False counter rollovers can cause huge counter discrepancies and consequently irrecoverable errors. This is because the control plane, unaware of the error, will continue maintaining and accumulating incorrect counter values.

When memory-read accesses take place at very high data rates (e.g., as is typical in a Gigabit Ethernet or faster interfaces), three principal types of memory-read errors are observed:

1. The memory-read operation may return a spurious value from the correct memory location (the "first type" of error).

2. The memory-read operation may return a correct value, but from an incorrect parameter-memory location (the "second type" of error).

3. The memory-read operation may return a correct value, but that value is presented out of sequence to the corresponding application (the "third type" of error).

Known solutions to the first type of error, including performing repeated read operations and selecting the value that occurs most often, do not properly handle the scenario of a rapidly-changing value in the memory-location address. Accordingly, despite reducing the occurrence of the first type of error, such solutions do not reduce the occurrences of the second and third types of error.

SUMMARY OF THE INVENTION

Certain embodiments of the invention aim to characterize and identify memory-read errors in a reliable fashion so that the incidence of errors can be reduced or eliminated.

In one embodiment, the present invention provides a method and apparatus for obtaining a reliable stored data value from a memory location of a memory. A sequence of N stored data values is read from a memory location of a memory to obtain a sequence of N read data values. For at least one read data value of the sequence, it is determined whether the read data value follows an expected trend relative to at least one other read data value of the sequence. If the read data value follows the expected trend, then a value (e.g., a median value) generated based on the sequence of N read data values is outputted.

DETAILED DESCRIPTION

Certain embodiments of the invention employ a method for reliably reading a continuously-changing value maintained in a memory location, including a set of techniques for detecting errors and identifying reliable values in a set of successive memory-read operations, as well as a fallback mechanism to signal a memory-read error in the event none of those techniques indicates a correct value with a sufficient level of confidence.

In one embodiment, the memory location is a counter in a network processor, such as a traffic-manager (TM) and/or traffic-shaper (TS) parameter memory, and a method consistent with the invention is implemented to reduce or eliminate errors that occur during the reading out of packet-counter values stored in the parameter memory. In this scenario, run-time environment (RTE) software or driver software accesses the parameter memory during read operations issued by a functional-programming layer (or application layer). This embodiment of the invention provides a mechanism to analyze and characterize parameter-memory reads when these locations are used to store byte-level and/or packet-level counters.

An application-level counter typically has a much-higher bit width than the corresponding counter maintained in the data plane. To keep its counter properly updated, the application periodically performs a read operation on the data-plane counter and accumulates the difference value in the higher bit-width application counter. If a false counter rollover is detected, then the error in the interpreted value of the counter can be relatively large. Due to the continuous accumulation of the difference value, even a very infrequent read error can cause a relatively large error to persist in the application-level counter, as will be demonstrated by the following example.

Exemplary Network Processor

Figure 1A:
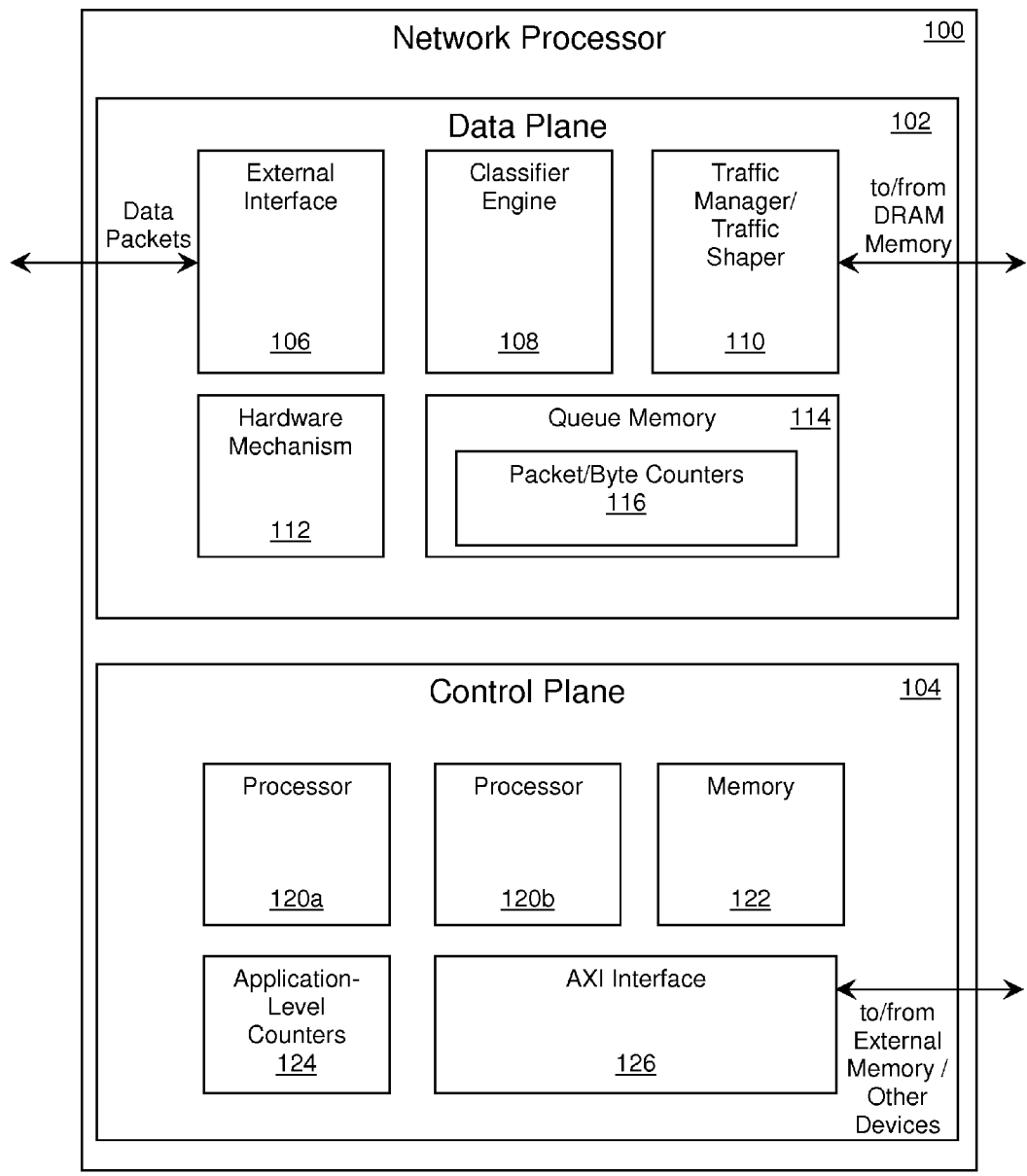
FIG. 1*a* is a block diagram illustrating an exemplary network processor in one embodiment of the invention.

FIG. 1a illustrates an exemplary network processor 100, which includes a data plane 102 and a control plane 104. Switching (i.e., packet forwarding) is performed in data plane 102, while routing (i.e., the exchange of routing information) is performed in control plane 104.

Data plane 102 includes external interface 106, a classifier engine 108, a traffic manager/traffic shaper (TM/TS) 110, a hardware mechanism 112, and a queue memory 114 that includes one or more packet/byte counters 116. External interface 106, which may include a plurality of physical-layer interfaces, including, e.g., MAC, 16-bit UTOPIA 2, SPI3, and POS-PHY2 interfaces, communicates and exchanges data packets with one or more physical-layer devices. Classifier engine 108 serves as a co-processor to optimize access-control list (ACL) processing and Layer-2 MAC-address lookups. TM/TS 110 decides where, when, and how incoming and outgoing data is routed. TM/TS 110, which is coupled to use DRAM memory (not shown), strips, adds, and modifies packet headers and also makes routing and scheduling decisions. Hardware mechanism 112 reads packet and byte counters 116 out of queue memory 114.

Control plane 104 includes processors 120a, 120b, a memory 122, one or more application-level counters 124, and an advanced extensible interface (AXI) 126. Processors 120a, 120b are coupled to employ memory 122, where instructions and/or program data reside. Processors 120a, 120b are responsible for performing a number of packet-specific operations that may be less time-critical than those performed in data plane 102, including, e.g., execution of routing protocols, management of routing tables, and so forth. Application-level counters 124 are counter registers that are maintained for software executed at the application level and are updated by control-plane logic based on packet and byte counters 116. AXI interface 126 provides a bus interface for control plane 104 to fetch instructions from external memory, read data from external memory, write data to external memory, and access peripheral devices.

It should be understood that network processor 100 may include one or more other additional elements not shown in FIG. 1a and may include fewer than all elements shown in FIG. 1a. For clarity, certain elements of network processor 100 are omitted from FIG. 1a, e.g., a memory controller, a security-protocol processor, an internal data-path memory, a management port, a segmentation engine, protocol data unit (PDU) buffers, a queue controller, a link list controller, a policing engine, a statistics engine, or the like.

Exemplary Sequence of Read Operations and Counter Corruption

Figures 1B, 2:
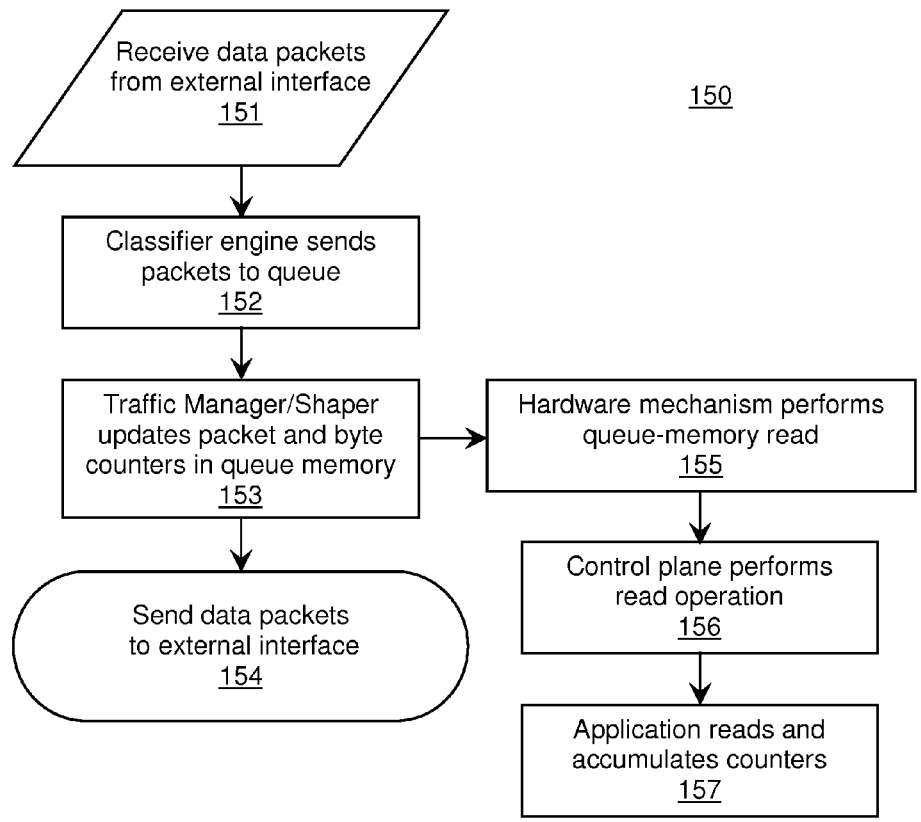
FIG. 1*b* is a flow diagram illustrating an exemplary sequence of read operations in the network processor of FIG. 1*a*.
FIG. 2 is a table showing, for each of a plurality of time instants, (i) the actual hardware counter value maintained in memory, (ii) the value returned as part of the memory-read operation, and (iii) the resultant application-level counter value calculated by the control-plane logic, including the interpretation of a false counter rollover.

FIG. 1b illustrates an exemplary sequence 150 of read operations in network processor 100. First, at step 151, data packets are received from external interface 106. Next, at step 152, classifier engine 108 sends those packets to queue memory 114. Then, at step 153, TM/TS 110 updates corresponding packet and byte counters 116 in queue memory 114 to reflect those packets received. Once the queue-level packet and byte counters 116 are updated, (i) at step 154, the data packets are forwarded to external interface 106, and (ii) at step 155, hardware mechanism 112 reads packet and byte counters 116 out of queue memory 114. Next, at step 156, control plane 104 receives the packet- and byte-counter values that were read out of queue memory 114 by hardware mechanism 112. Next, at step 157, the control-plane logic (as provided, e.g., from memory 122) uses the read-out counter values to update corresponding application-level counters 124. In the scenario of FIG. 1b, an exemplary illustration of counter corruption due to a spurious memory-read error occurring during step 155 will now be discussed with reference to the table of FIG. 2, which shows, for each of time instants i through (i+2), (i) the actual 32-bit hardware counter value maintained in memory, (ii) the value returned as part of the memory-read operation, and (iii) the resultant application-level counter value calculated by the control-plane logic (including the interpretation of a false counter rollover).

As shown, in this example, at time instant i, the actual value maintained in the data plane is 20000, which value is correctly read out and returned in the control plane as 20000. Consequently, the control-plane logic calculates and stores 20000 as the application-level version of the counter.

Next, at time instant (i+1), a read error occurs when the actual value maintained in the data plane is 40000, but that value is not correctly read out. Instead, an erroneous value of only 1000 is returned in the control plane. Based on this erroneous value, the control-plane logic detects a false counter rollover due to the fact that the value of 1000 returned in the control plane at time instant (i+1) is smaller than the value of 20000 returned in the previous iteration at time instant i. On this basis, the control-plane logic calculates the application-level counter value as $((2^{32}-1-20000)+1000)$, or 4294948295, which is a highly erroneous value.

Subsequently, at time instant (i+2), the actual value maintained in the data plane is 60000, which value is correctly read out and returned in the control plane as 60000. However, because the application-level counter was corrupted at time instant (i+1) due to the spurious value of 1000 that was returned, the control-plane logic now calculates and stores the erroneous value of (4294948295+(60000−1000)), or 4295007295, as the control-plane version of the counter.

Thus, it can be seen that, even though the memory location in the data plane maintains the correct counter value at all times, an erroneous application-level counter value results from the incorrect value returned to the control plane during the flawed memory-read operation at time instant (i+1).

Experimental Data and Types of Errors

To solve the problems that arise from transient spurious memory-read errors, such as those discussed in the foregoing example, the inventors obtained experimental data by performing several hours of soak tests (i.e., tests to verify stability and performance characteristics over an extended period of time) on multiple different platforms using the LSI APP3K network processor. The frequency of errors, as well as the maximum burstiness of such errors (i.e., a ratio of the number of erroneous reads in a limited set of N consecutive reads) was studied in soak tests spanning several days. The parameter of maximum burstiness is an important parameter, because the detection of errors and the consequent selection of a correct value in a sample set containing both good and spurious values depends on this parameter. To illustrate this point, if there are 50% spurious values in N consecutive read operations, then the detection of spurious values is very difficult. On the other hand, if there are only 10% spurious values in a set of N consecutive reads, then the detection and filtering of spurious values is much easier. Traffic was pumped into the network at various rates in these experiments to study the effect of traffic rate on these transient read errors.

Based on the experimental observations, two parameters were found to have a direct bearing on the frequency as well as maximum burstiness of the memory-read errors: (i) hardware platform and (ii) traffic rate.

The error rate and burstiness of memory-read errors were found to be different in different hardware platforms, which may be due to various hardware-parameter differences across various platforms, as well as other operating-environment parameters (e.g., temperature) that could also potentially influence such errors.

It was further observed that, the higher the traffic rate, the higher the error rate and burstiness of memory-read errors. At relatively low rates (e.g., 100 Mbps), there were few incidents of memory-read errors. On the other hand, at Gigabit Ethernet rates (e.g., 1000 Mbps and faster), the rate and burstiness of memory-read errors was found to be much higher.

In the network processors, read errors observed in the case of TM/TS-parameter reads were found to be caused by: (i) the read operation from the control plane returning a spurious value instead of the correct value maintained in the read memory location (the "first type" of error), (ii) address-aliasing errors, namely, the read operation returning a correct value but from a memory location other than the intended memory location (the "second type" of error), and (iii) the read operation returning a correct value from the memory location but in an out-of-sequence manner when multiple read operations are scheduled from the control plane (the "third type" of error).

The set of experiments that were conducted verified that the memory locations always maintained the correct value, and that the sequence of read operations taking place was the cause of the issue, i.e., the first, second, and/or third types of error were responsible for generating the read error. By running these tests for several days, it was also confirmed empirically that, when erroneous values are returned during the first type of error, the error usually occurred in only one or two bytes of the sequence of bytes read in a single read operation.

Exemplary Scheme for Error Reduction

The first step in providing a mechanism for reducing and/or eliminating errors is to reliably identify an erroneous value when a read operation is performed from the control plane. In certain embodiments of the invention, three different techniques can be used, either alone or in combination with one another, to identify erroneous values.

The first technique employs a checksum procedure for all of the data bytes read in a typical read operation, to verify the integrity of the read-out data. Initially, a first-checksum value is calculated in the data plane when the logic writes this data, and the first-checksum value is stored along with the data values. The same checksum algorithm is later used in the control-plane read operation to generate a second-checksum value, which is compared against the stored first-checksum value for the data bytes read. If there are N bytes of data read out during a read operation, and a 16-bit checksum is used, then each read operation reads a total of (N+2) bytes of data. An erroneous value can be returned during a read of any one or more data bytes, including a read of the data values themselves or a read of the corresponding checksum value. In either of these cases, the read-out checksum and the calculated checksum will not match. For the foregoing checksum technique, a single checksum value can be generated for each individual counter or memory location, or alternatively, a single checksum value can be generated for a plurality of counters or memory locations. Although this is a reliable error-detection mechanism for the first type of error described above, the use of checksum values does not detect the second and third types of errors. The reason for this is that the second and third types of errors do not involve data corruption, but rather, those types of errors are due to a read of correct data from an incorrect, unintended, or unexpected memory location. Moreover, a checksum mechanism alone might detect a "false positive," such as when more than one error occurs in a single read. For example, if one data bit is incorrectly read as a 1 and a different data bit is incorrectly read as a 0, then the data might will pass the checksum test, because the correct checksum will still be computed. As another example, an error can occur in the data and another error in the checksum such that the data will still pass the checksum test.

The second technique returns the base-memory location of the read-out data values along with the data values themselves. This method is used to detect the address-aliasing errors that occur in the second type of error. An effective way to verify whether the data is received from the desired memory location is to return the address of the memory location that is being read out along with the data that is read out. In one embodiment, parameter memory is used to represent a counter that is specific to each queue. Since the control plane-based read operation of this data is per-queue, if the data plane returns an identifier of the corresponding queue along with the data bytes, then the control plane can verify whether the data is read from the parameter memory of the correct queue. Although this is a reliable error-detection mechanism for the second type of error described above, returning memory locations along with data does not detect the first and third types of errors.

The third technique performs a trend analysis to identify out-of-sequence values. This method can be used to detect the third type of error, which is the most-complex error scenario and cannot be detected by the first (checksum) or second (memory-address information) techniques. The trend-analysis technique employs prior knowledge of the nature and sequence of the values being read. In this approach, instead of a single read, a series of consecutive read operations are performed. Subsequently, the values in each of the read samples in the set are analyzed to detect out-of-sequence reads. Further details of the trend-analysis technique will now be explained.

In the packet-counter scenario, the data that is updated by the data plane and read periodically by the control plane is a set of data-packet counters, each of which continuously increases monotonically, except in the event of counter rollover. In other words, if any two consecutive reads for a particular packet counter are performed at instances $t_1$ and $t_2$ such that $t_2 > t_1$, the value at instant $t_2$ should be higher than the value at instant $t_1$. The only exception to this trend is counter overflow, i.e., the case where the counter value exceeds the fixed bit width and restarts from zero. In other words, each counter is normally expected to show a monotonically non-decreasing trend across consecutive read operations.

The trend-analysis technique for extracting a value in the correct sequence is based on reading a set of consecutive samples. Instead of performing a single read operation, a set of N consecutive read operations are performed, with each read operation corresponding to a single sample. Since the frequency of occurrence of out-of-sequence values is low, the expectation is that, of the N samples, a majority of the samples will be in sequence. In one embodiment, of these N samples, the subset of monotonically non-decreasing values that has the largest number of values is selected. For example, suppose N=100, and there are three subsets within those 100 values having values that are monotonically non-decreasing: a first subset of 7 values, a second subset of 42 values, and a third subset of 23 values. The "correct" value to select (i.e., a reliable value to return as a result of the read operation) would be the median value of the second subset (of 42 monotonically non-decreasing values), because that subset has the largest number of values (i.e., 42) from among the three subsets (i.e., 7, 42, and 23).

The trend-analysis technique may not work correctly if the subset size is less than N/2. Accordingly, if the subset size is smaller than N/2, then the set of N consecutive reads is rejected, and another set of N reads is performed. This set of N reads is performed a maximum of M times. If none of the M read operations results in a correct value, with each operation extracting N samples, then an irrecoverable error is returned to the application layer. This irrecoverable-error scenario is of an extremely low probability and was never actually encountered during the inventors' experimental scenarios, even under heavy traffic load and live-network testing.

The trend-analysis technique can correctly handle the counter-rollover condition. If rollover occurs in the middle of a set of N reads, then it might not be possible to determine a subset of N/2 of increasing values. However, the subsequent iteration of N reads compensates for rollover occurring in the middle of a set of N reads.

An adaptive-tuning method can be used to optimize parameter values for the number N of samples read, as well as the maximum number M of such reads, both of which can be tunable parameters. In a practical system, these values can be hardcoded based on empirical data obtained through experimental and/or live-network testing. However, these parameters can also be made adaptive based on previous read operations. If the number N of values in the subset of the monotonically-increasing values is greater than an upper-threshold value, then the value of N can be reduced in the next iteration by a fixed step size, which is identified by the variable step. On the other hand, if the number N of values in the subset is smaller than a lower-threshold value, then the value of N can be increased by the fixed step size step. These can be bounded by keeping track of a minimum value $N_{lt}$ for N and a maximum value $N_{ut}$ for N. Mathematically, this can be represented as:

$$\{N : N \in [N_{lt}, N_{lt}+\text{step}, N_{lt}+2^*\text{step}, \ldots, N_{ut}]\}. \quad (1)$$

In Equation (1), the variable $N_{lt}$ refers to the lower-threshold value of N, i.e., the minimum value, and the variable $N_{ut}$ refers to the upper-threshold value of N, i.e., the maximum value. The actual value of N can vary between lower threshold $N_{lt}$ and upper threshold $N_{ut}$. The value of N can be increased or decreased by fixed integer step sizes. These thresholds and step sizes can be configured based on empirical data. The step sizes for increasing N and decreasing N do not necessarily have to be the same. In practical cases, a fixed value of N can also suffice.

Figure 3A:
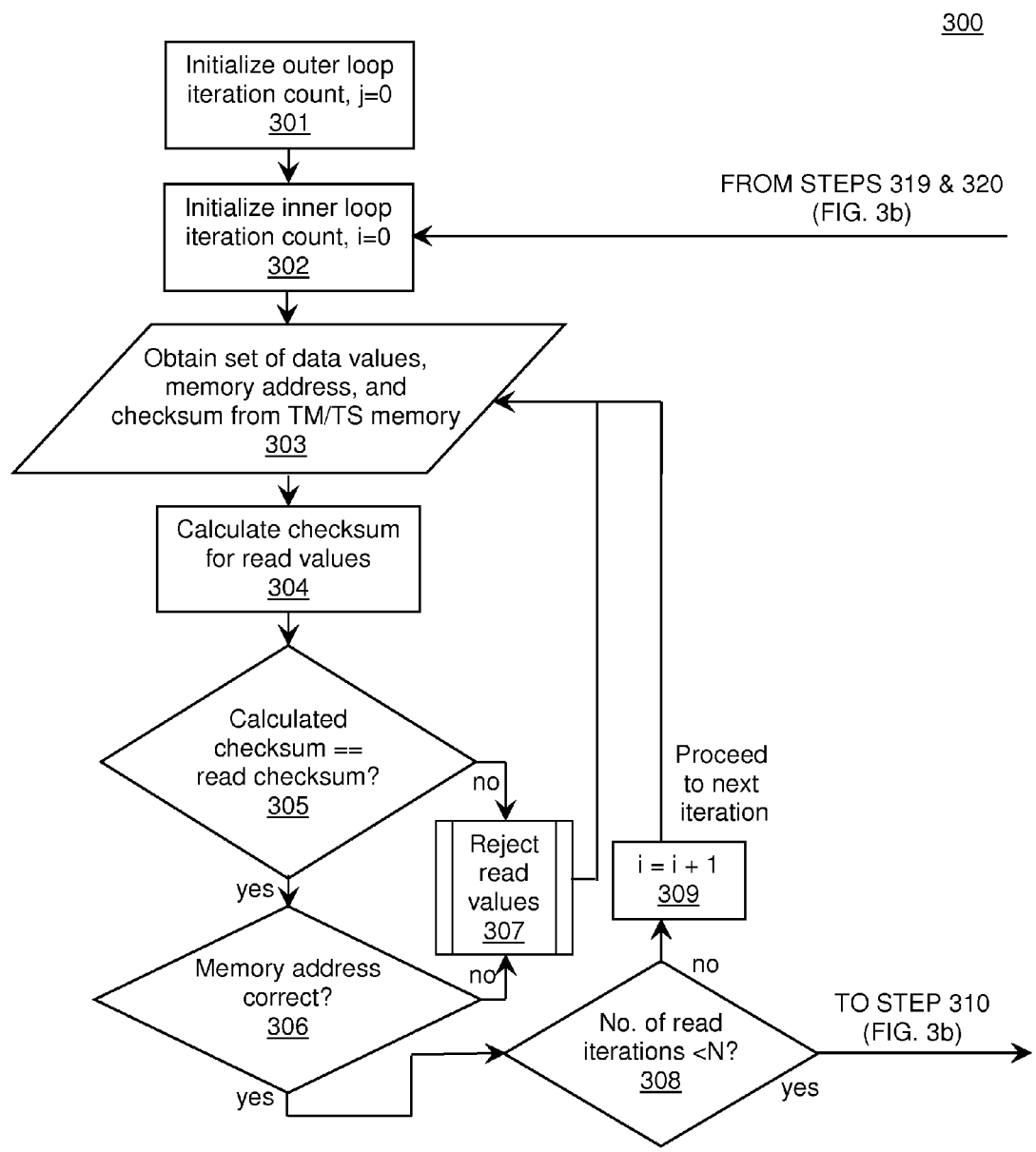
FIGS. 3a and 3b are collectively a flow diagram illustrating an exemplary method employing a combination of checksum, address-aliasing, and trend-analysis techniques to identify and/or correct errors in connection with a read operation from memory used to store rapidly-changing counter values.
Figure 3B:
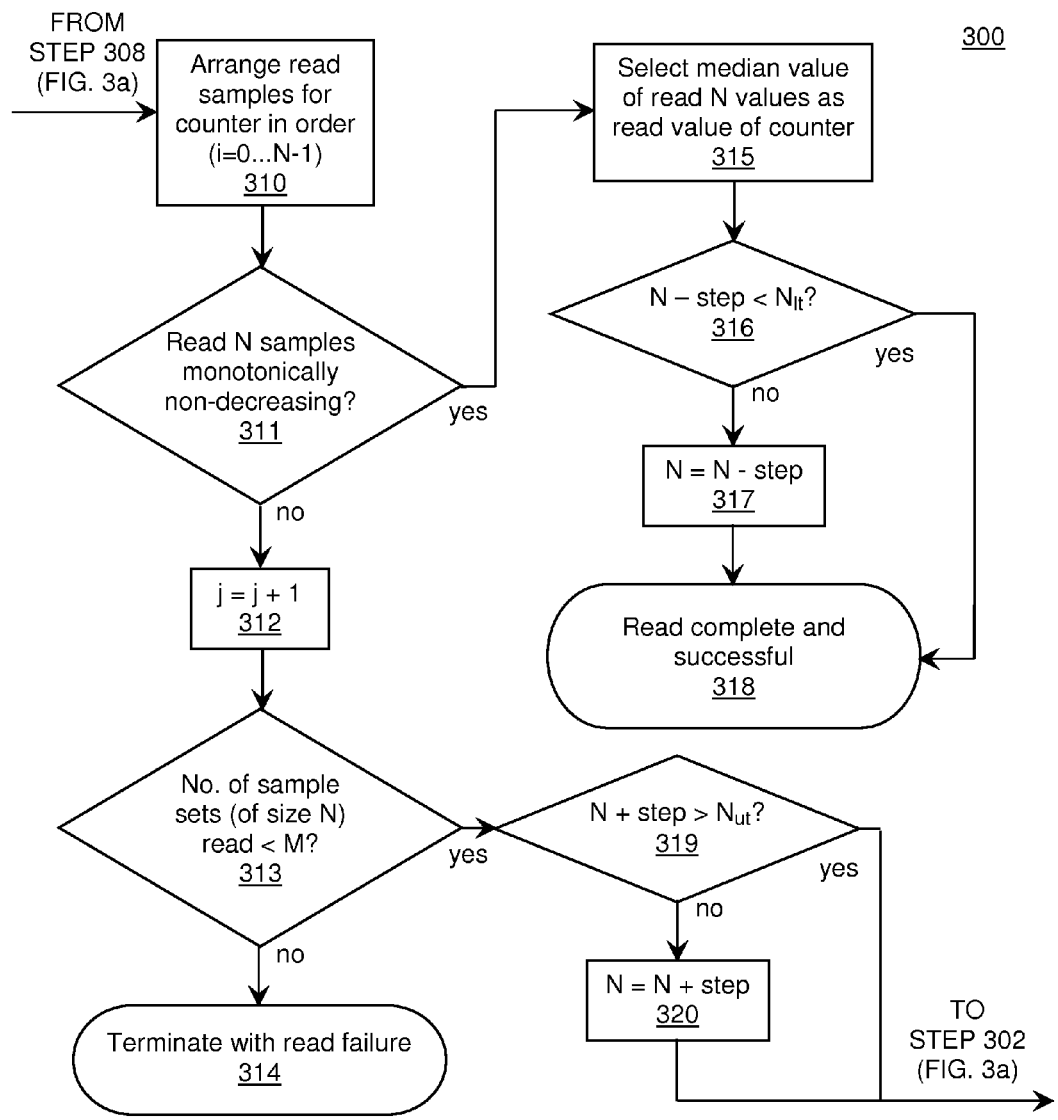

By combining the first, second, and third techniques described above, as will now be explained with reference to flowchart 300 of FIGS. 3a and 3b, all occurrences of the first, second, and third types of error can reliably be detected. It is noted that, in this embodiment, the checksum steps (including steps 303, 304, and 305) and address-aliasing steps (including steps 303 and 306) are performed for the entire set of read counter values, while the trend-analysis steps (including steps 310 and 311) are performed for each separate counter value.

First, at step 301, an outer-loop counter is initialized by setting the value of counter j to zero. Next, at step 302, an inner-loop iteration count is initialized by setting the value of counter i to zero.

Next, at step 303, the TM/TS-parameter memory is read to obtain (i) a set of two or more data values, (ii) a stored checksum for those data values (preferably, for each read operation, a single checksum value is retrieved that corresponds to a plurality of counters), and (iii) the base address of the TM/TS memory at which those data values are stored.

Next, at step 304, a checksum for the read values is calculated. Next, at step 305, the calculated checksum is compared with the read checksum. The calculated checksum is calculated using the same algorithm that originally generated and wrote the stored checksum that was read out at step 303. If the values do not match, then, at step 307, the read values are rejected, and the method returns to step 303 so that the values and checksum can be re-read. If the values match, then the method proceeds to step 306.

At step 306, a determination is made whether the address of the memory location being read out matches the intended memory address for the current data read. If the memory location does not match (indicating that data values were read from an unintended memory address location), then, at step 307, the read values are rejected, and the method returns to step 303 so that the values and checksum can be re-read. If the memory locations match, then the method proceeds to step 308.

At step 308, a determination is made whether the number of read iterations has reached a given threshold N (the selection of N is discussed in further detail above). If threshold N has not been reached, then, at step 309, the value of counter i is incremented by 1, and the method returns to step 303 so that the values and checksum can be re-read. If the threshold has been reached, then the method proceeds to step 310. It is noted that, in some embodiments, the value of N is a constant, and in other embodiments, N takes the form of a small range of values whose upper limit $N_{ut}$ and lower limit $N_{lt}$ are constants selected based on empirical knowledge of error rates.

At step 310, the N read samples for the counter are arranged in order from i=0, . . . , N−1. Next, at step 311, a determination is made whether the N samples are monotonically non-decreasing. This is done based on the rationale that, for any particular packet counter, consecutive values should be non-decreasing (except at counter rollover), so successive reads should always exhibit a monotonically non-decreasing trend. If, at step 311, it is determined that the N samples are monotonically non-decreasing, then the method proceeds to step 315. If not, then the method proceeds to step 312.

At step 315, the median value of the read N values is selected as the read value of the counter. Next, at step 316, a determination is made whether N minus step size step is less than the lower-threshold value $N_{lt}$ of N. If so, then the method proceeds to step 318. If not, then, at step 317, the value of N is decremented by step size step, and the method then proceeds to step 318. At step 318, the method terminates with a complete and successful read condition.

At step 312, the value of counter j is incremented by 1. Next, at step 313, a determination is made whether the number of sample sets of size N is less than the maximum number M of reads. If not, then the method proceeds to step 314. If so, then, at step 319, a determination is made whether N plus step size step is greater than the upper threshold value $N_{ut}$ of N. If so, then the method returns to step 302. If not, then, at step 320, the value of N is incremented by step size step, and the method then proceeds to step 302.

At step 314, the method terminates with a read failure condition.

It is noted that, in the foregoing method, the inner loop eventually counts up to a value of N, which represents the number of samples used for trend analysis. If a valid value exists in this set, then the operation completes with a success condition. Otherwise, another set of N reads is performed, for a maximum of M times. If all M read iterations fail, then the operation completes with a read failure being reported to the application. To achieve adaptive step-size adjustment, the value of N can be increased or decreased in integer steps, in a small range (e.g., in steps 317 and 320). This adaptive method analyzes the statistical pattern of memory-read errors and uses this analysis to tune the memory-read mechanism.

Alternative Embodiments

Although the foregoing description discusses a method in which checksum, address-aliasing, and trend-analysis techniques are all used, to identify as many types of errors as possible, fewer than all three techniques could alternatively be used in alternative embodiments. In one embodiment, a sequence of read operations is performed by employing a combination of a trend-analysis technique with only one other of these techniques, with the goal of reliable detection of memory-read errors and the selection of a correct value. In another embodiment, only a trend-analysis technique is used, without any checksum or address-aliasing techniques being used at all.

The term "memory," as used herein, can refer to a single portion of a physical memory device, an entire physical memory device, a plurality of physical memory devices, or portions of a plurality of physical memory devices.

The term "memory location," as used herein and in the appended claims, means one or more addressable areas for the storage of data. Those one or more addressable areas can be individual memory cells and/or groups of memory cells. Those memory cells and/or groups of memory cells can be read and/or written simultaneously (e.g., as sections or entire rows in a memory array), or can alternatively be read and/or written at different times and in various sequences. Those memory cells and/or groups of memory cells may be contiguous or non-contiguous and may reside on a single physical memory device or span multiple physical memory devices.

While, in certain embodiments, the memory location is used to store a rapidly-changing counter value, it should be understood that, in other embodiments, the memory location can be used for storing and retrieving other types of data and does not necessarily have to contain rapidly-changing and/or counter values.

The terms "median" and "median value," as used herein, refer to (i) a value in a set of values at which (or near which) about 50% of the other values in the set are smaller and about 50% of the other values in the set are greater, or alternatively, (ii) a value that is not part of the set of values itself, but at which (or near which) about 50% of the values in the set are smaller and about 50% of the values in the set are greater (e.g., if there is an even number of values in the set, then there is no single middle value in the set, and so the median might then be defined as the mean of the two middle values).

Further, although specific embodiments are described herein in which a median value generated based on a sequence of N read data values, or a subset thereof, is used as an output value, it should be recognized that other values based on the N read data values, or a subset thereof, could be outputted in alternative embodiments. For example, the first or last value in the set of N read values, the average value, a weighted average value, or some other value based on one or more of the N read values could be outputted instead of outputting a median value. It should be understood that the terms "trend" and "expected trend," as used herein, include not only monotonically-increasing trends, as described in the embodiments discussed herein, but also monotonically-decreasing trends and other types of trends.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, or general-purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

We claim:

1. A method for obtaining a stored data value from a memory location of a memory, the method comprising:
   (a) reading a sequence of N stored data values from a memory location of a memory to obtain a sequence of N read data values;
   (b) for at least one read data value of the sequence, determining whether the read data value follows an expected trend relative to at least one other read data value of the sequence; and
   (c) if the read data value follows the expected trend, then outputting a value generated based on the sequence of N read data values,
   wherein the outputted value is a median value of the subset that has the largest number of values from among all subsets of values that follow the expected trend in the set of N read data values.

2. The invention of claim 1, wherein:
   the memory contains a stored checksum value generated by an algorithm using one or more of the N stored data values as input values, and further comprising:
   reading the stored checksum value from the memory to obtain a read checksum value;
   using the algorithm to generate a calculated checksum value, wherein the algorithm uses one or more of the N read data values as input values; and
   comparing the calculated checksum value with the stored checksum value.

3. The invention of claim 2, wherein steps (b) and (c) are performed only if the calculated checksum value matches the stored checksum value.

4. The invention of claim 1, wherein:
   identification of the specified memory location for performing step (a) is specified as part of a read request, and further comprising:
   determining the actual memory location from which the sequence of N stored data values was read in step (a); and
   comparing the specified memory location with the actual memory location.

5. The invention of claim 4, wherein steps (b) and (c) are performed only if the specified memory location matches the actual memory location.

6. The invention of claim 1, wherein the expected trend is a monotonically-increasing trend.

7. The invention of claim 1, wherein the largest number of values is greater than or equal to N/2.

8. The invention of claim 1, further comprising, if the read data value does not follow the expected trend, then repeatedly performing steps (a) through (c) until the read data value follows the expected trend.

9. The invention of claim 8, further comprising ceasing the repetition of steps (a) through (c) if a maximum number M of iterations is reached.

10. The invention of claim 9, wherein the value of M is adaptively determined based on one or more prior read operations.

11. The invention of claim 1, wherein the value of N is adaptively determined based on one or more prior read operations.

12. The invention of claim 1, further comprising:
   selecting the subset that has the largest number of values from among all subsets of values that follow the expected trend in the set of N read data values;
   if the number of values in the selected subset of values is greater than an upper threshold, then reducing the value of N by a fixed step size; and
   if the number of values in the selected subset of values is smaller than a lower threshold, then increasing the value of N by a fixed step size.

13. Apparatus for obtaining a reliable stored data value from a memory location of a memory, the apparatus adapted to:
   (a) read a sequence of N stored data values from a memory location of a memory to obtain a sequence of N read data values;
   (b) for at least one read data value of the sequence, determine whether the read data value follows an expected trend relative to at least one other read data value of the sequence; and
   (c) if the read data value follows the expected trend, then output a value generated based on the sequence of N read data values,
   wherein the outputted value is a median value of the subset that has the largest number of values from among all subsets of values that follow the expected trend in the set of N read data values.

14. The invention of claim 13, wherein the expected trend is a monotonically-increasing trend.

15. The invention of claim 13, wherein the largest number of values is greater than or equal to N/2.

16. The invention of claim 13, wherein the apparatus is further adapted to:
   select the subset that has the largest number of values from among all subsets of values that follow the expected trend in the set of N read data values;

if the number of values in the selected subset of values is greater than an upper threshold, then reduce the value of N by a fixed step size; and if the number of values in the selected subset of values is smaller than a lower threshold, then increase the value of N by a fixed step size.

17. A method for obtaining a stored data value from a memory location of a memory, the method comprising:
(a) reading a sequence of N stored data values from a memory location of a memory to obtain a sequence of N read data values;
(b) for at least one read data value of the sequence, determining whether the read data value follows an expected trend relative to at least one other read data value of the sequence;
(c) if the read data value follows the expected trend, then outputting a value generated based on the sequence of N read data values;
(d) selecting the subset that has the largest number of values from among all subsets of values that follow the expected trend in the set of N read data values;
(e) if the number of values in the selected subset of values is greater than an upper threshold, then reducing the value of N by a fixed step size; and
(f) if the number of values in the selected subset of values is smaller than a lower threshold, then increasing the value of N by a fixed step size.

18. The invention of claim 17, further comprising:
(g) after performing steps (d) through (f), repeating steps (a) through (c) with an increased or reduced value of N.

19. The invention of claim 17, wherein:
the memory contains a stored checksum value generated by an algorithm using one or more of the N stored data values as input values, and further comprising:
reading the stored checksum value from the memory to obtain a read checksum value;
using the algorithm to generate a calculated checksum value, wherein the algorithm uses one or more of the N read data values as input values; and
comparing the calculated checksum value with the stored checksum value.

20. The invention of claim 19, wherein steps (b) and (c) are performed only if the calculated checksum value matches the stored checksum value.

21. The invention of claim 17, wherein:
identification of the specified memory location for performing step (a) is specified as part of a read request, and further comprising:
determining the actual memory location from which the sequence of N stored data values was read in step (a); and
comparing the specified memory location with the actual memory location,
wherein steps (b) and (c) are performed only if the specified memory location matches the actual memory location.

22. The invention of claim 17, wherein the expected trend is a monotonically-increasing trend.

23. The invention of claim 17, wherein the outputted value is a median value of a selected subset of values in the set of N read data values.

24. The invention of claim 23, wherein the selected subset of values is the subset that has the largest number of values from among all subsets of values that follow the expected trend in the set of N read data values.

25. The invention of claim 17, further comprising, if the read data value does not follow the expected trend, then repeatedly performing steps (a) through (c) until the read data value follows the expected trend.

26. The invention of claim 25, further comprising ceasing the repetition of steps (a) through (c) if a maximum number M of iterations is reached.

27. The invention of claim 26, wherein the value of M is adaptively determined based on one or more prior read operations.

28. The invention of claim 17, wherein the value of N is adaptively determined based on one or more prior read operations.

29. Apparatus for obtaining a reliable stored data value from a memory location of a memory, the apparatus adapted to:
(a) read a sequence of N stored data values from a memory location of a memory to obtain a sequence of N read data values;
(b) for at least one read data value of the sequence, determine whether the read data value follows an expected trend relative to at least one other read data value of the sequence; and
(c) if the read data value follows the expected trend, then output a value generated based on the sequence of N read data values;
(d) select the subset that has the largest number of values from among all subsets of values that follow the expected trend in the set of N read data values;
(e) if the number of values in the selected subset of values is greater than an upper threshold, then reduce the value of N by a fixed step size; and
(f) if the number of values in the selected subset of values is smaller than a lower threshold, then increase the value of N by a fixed step size.

30. The invention of claim 29, wherein the apparatus is further adapted to:
(g) after performing steps (d) through (f), repeat steps (a) through (c) with an increased or reduced value of N.

31. The invention of claim 29, wherein the expected trend is a monotonically-increasing trend.

32. The invention of claim 29, wherein the outputted value is a median value of a selected subset of values in the set of N read data values.

33. The invention of claim 32, wherein the selected subset of values is the subset that has the largest number of values from among all subsets of values that follow the expected trend in the set of N read data values.

34. The invention of claim 33, wherein the largest number of values is greater than or equal to N/2.

* * * * *